(12) United States Patent
Jang et al.

(10) Patent No.: US 7,142,199 B2
(45) Date of Patent: Nov. 28, 2006

(54) MATRIX TYPE-FLAT-PANEL DISPLAY DEVICE HAVING MULTI DATA LINES AND METHOD FOR DRIVING THE SAME

(75) Inventors: Jae-eun Jang, Suwon (KR); Jung-woo Kim, Yongin (KR); Soo-joung Lee, Seoul (KR)

(73) Assignee: Samsung SDI Co., Ltd., Suwon (KR)

( * ) Notice: Subject to any disclaimer, the term of this patent is extended or adjusted under 35 U.S.C. 154(b) by 239 days.

(21) Appl. No.: 09/877,072

(22) Filed: Jun. 11, 2001

(65) Prior Publication Data

US 2002/0033807 A1    Mar. 21, 2002

(30) Foreign Application Priority Data

Aug. 4, 2000    (KR)    ................................. 2000-45277

(51) Int. Cl.
  *G09G 5/00*    (2006.01)
(52) U.S. Cl. .................... 345/204; 345/76; 345/87; 345/92; 345/93; 345/100; 349/139; 349/143; 349/148; 349/149
(58) Field of Classification Search ............ 345/60–67, 345/87, 89, 98–101, 204–209, 211, 212, 88, 345/92–96; 315/169.1–169.4; 349/94, 96, 349/100, 89, 98; 359/54
See application file for complete search history.

(56) References Cited

U.S. PATENT DOCUMENTS

| | | | |
|---|---|---|---|
| 4,602,292 A | | 7/1986 | Togashi et al. |
| 4,816,816 A | * | 3/1989 | Usui ........................... 340/784 |
| 5,040,874 A | * | 8/1991 | Fukuda ........................ 345/98 |
| 5,159,476 A | * | 10/1992 | Hayashi ....................... 349/39 |
| 5,648,793 A | * | 7/1997 | Chen .......................... 345/96 |
| 5,774,106 A | * | 6/1998 | Nitta et al. .................. 345/98 |
| 6,067,063 A | * | 5/2000 | Kim et al. .................... 345/89 |
| 6,320,562 B1 | * | 11/2001 | Ueno et al. ................... 345/87 |
| 6,404,410 B1 | * | 6/2002 | Shirae ......................... 345/55 |
| 6,411,268 B1 | * | 6/2002 | Nakamura et al. ............ 345/60 |
| 6,426,595 B1 | * | 7/2002 | Odake et al. ............. 315/169.1 |

* cited by examiner

*Primary Examiner*—Richard Hjerpe
*Assistant Examiner*—Jennifer T. Nguyen
(74) *Attorney, Agent, or Firm*—Buchanan Ingersoll & Rooney PC

(57) ABSTRACT

A matrix type flat-panel display device having multi data lines and a method for driving the matrix type flat-panel display device are provided. The matrix type flat-panel display device in which a plurality of data lines are assigned to each of a plurality of columns consisting of pixels and each data line is arranged to correspond one-to-one with pixels to which each scanning line is connected, makes it possible to increase the number of the scanning lines which can be driven at the same time, thereby extending dwell time by multiplying it by the number of the data lines assigned to each of a plurality of columns consisting of pixels.

5 Claims, 3 Drawing Sheets

MATRIX TYPE-FLAT-PANEL DISPLAY DEVICE HAVING MULTI DATA LINES AND METHOD FOR DRIVING THE SAME

BACKGROUND OF THE INVENTION

1. Field of the Invention

The present invention relates to a matrix type flat-panel display device including multi data lines, in which a plurality of data lines are formed to correspond to pixels, and a method for driving the matrix type flat-panel display device.

2. Description of the Related Art

FIGS. 1A and 1B illustrate a method for driving a conventional matrix type flat-panel display device. Referring to FIG. 1A, a scanning pulse is applied to a first scanning line and then data pulses are simultaneously applied to all data lines. Referring to FIG. 1B, a scanning pulse is applied to a second scanning line and then data pulses are simultaneously applied to all data lines. Accordingly, if a scanning pulse is sequentially applied to scanning lines, data pulses are applied to all data lines at the same time.

As mentioned above, the structure of a circuit used in a conventional matrix type flat-panel display device and a method for driving a conventional matrix type flat-panel display device are quite simple. Accordingly, the manufacture and design of the circuit unit are simple. However, in the case of driving a conventional matrix type flat-panel display device, as the resolution increases, that is to say, as the number of scanning lines increases, the time each electrode is driven is reduced. In other words, as shown in the following Table 1, if the resolution of a flat-panel display device is gradually increased from QVGA to SXGA under a driving condition of 60 Hz, the dwell time of a flat-panel display device is reduced to one fourth, from 69 μsec to 17 μsec.

TABLE 1

| Resolution | QVGA 320 × 240 | VGA 640 × 480 | SVGA 800 × 600 | XGA 1024 × 768 | SXGA 1280 × 1024 |
|---|---|---|---|---|---|
| Dwell time (%) | 69 μsec (100%) | 35 μsec (50%) | 28 μsec (40%) | 22 μsec (31%) | 17 μsec (24%) |
| Brightness | 100% | 39% | 27% | 20% | 10% |

The decrease in dwell time accompanying the increase in resolution indicates that the time taken for each pixel to emit light decreases. Consequently, the brightness of a flat-panel display device also decreases. That is, the brightness is reduced to one fourth.

Also, Table 1 shows variations in the brightness of a green fluorescent substance which is commonly used in a cathode ray tube (CRT) using an electron gun. Referring to the variations, the brightness is reduced to one tenth. Therefore, in a matrix drive, a method for increasing the dwell-time of a flat-panel display device makes it possible to easily increase the brightness.

To increase the dwell-time of a flat-panel display device, a method which can double the dwell-time has been used. In this method, data lines are divided into two parts-upper and lower parts (e.g., data line a belongs to the upper part and data line b belongs to the lower part), and accordingly, scanning lines corresponding to the data lines are divided into two groups-a first scanning line group 10 belonging to the upper part and a scanning line group 20 belonging to the lower part as shown in FIG. 2. Then, two scanning lines selected from each of the two scanning line groups are driven simultaneously, thereby increasing the dwell-time of a flat-panel display device. As a result, however, the dwell time of a flat-panel display device in case the resolution is SXGA, is 35 μsec, and at this time the brightness is only 40% of the brightness when the dwell time is 69 μsec. Therefore a flat-panel display device needs a new structure which makes it possible to considerably increase its dwell-time.

SUMMARY OF THE INVENTION

To solve the above problem, it is an object of the present invention to provide a matrix type flat-panel display device having multiple data lines, which is capable of extending the dwell time by multiplying it by the number of data lines assigned to each column of pixels. The matrix type flat-panel display device according to the present invention has a structure differing from a conventional matrix structure in which data lines in a matrix type flat-panel display device are divided into upper and lower parts, in which a plurality of data lines are formed so as to correspond to each of a plurality of columns consisting of pixels and the data lines assigned to the same pixel column are simultaneously driven.

According, to achieve the above object of the present invention, there is provided a matrix type panel display device having a first plate and a second plate with the surface uniformly spaced from the first plate. Scan lines are arranged to correspond to pixel rows in a first direction on the first plate and data line are arranged in a striped pattern in a second direction crossing the scan lines on the second plate. There are at least two data lines corresponding to each pixel column that when at least two scan lines and at least two data lines corresponding to a column are biased appropriately at least two adjacent pixels in said column 1 are simultaneously operated.

To achieve the above object of the invention, it is further provided the method for driving a matrix type panel display device according to the present invention as described above. The method for driving the matrix type panel displayed device includes the steps of applying a data signal to each of the data lines arranged to correspond to a column of pixels at the same time and simultaneously driving as many of the scan lines as the data lines arrange to correspond to the columns of pixels in response to the data signal.

BRIEF DESCRIPTION OF THE DRAWINGS

The above objects and advantage of the present invention will become more apparent by describing in detail a preferred embodiment thereof with reference to the attached drawings in which.

DETAILED DESCRIPTION OF THE PRESENT INVENTION

The present invention will now be described more fully with reference to the accompanying drawings, in which preferred embodiments of the invention are shown.

A matrix type flat-panel display device according to the present invention is characterized by a plurality of data lines being formed so as to correspond to each of a plurality of columns of pixels such that the data lines can be made to correspond to pixels belonging to different rows. Even if a plurality of data lines corresponding to each of the pixel columns are driven at the same time, pixels belonging to different rows are operated. Therefore, the dwell-time can be extended by multiplying it by the number of data lines assigned to each pixel column.

Figure 1A:
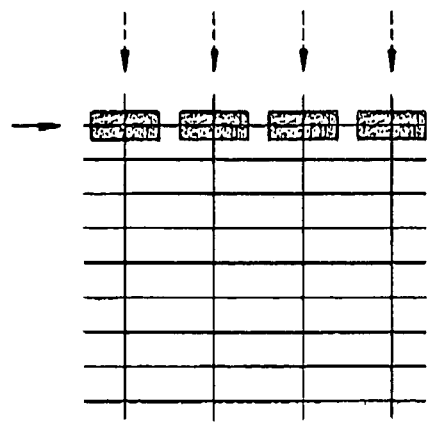
FIGS. 1A and 1B are diagrams illustrating a method for driving a conventional matrix type flat-panel display device.
Figure 1B:
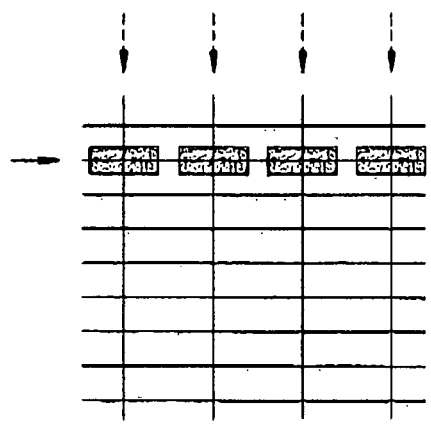
Figure 3:
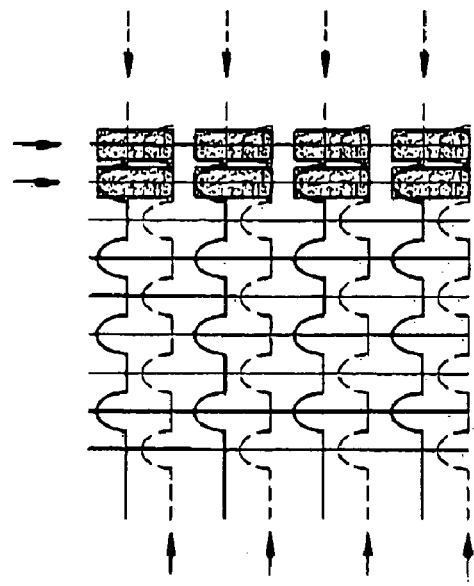
FIG. 3 is a diagram illustrating a multi matrix flat-panel display device having multi data lines and a method for driving the same according to present invention.

FIG. 3 shows the electrode structure of a matrix type flat-panel display device having multi data lines according to an embodiment of the present invention. In this embodiment, two data lines are formed for each column of pixels. Data lines belonging to the first row of pixels are formed so as to be operated corresponding to pixels in odd-numbered rows. On the other hand, data lines belonging to the second row of pixels are formed to be operated corresponding to pixels in even-numbered rows. The electrode structure illustrated in FIG. 3 is different from the conventional matrix structure illustrated in FIG. 1 in that two data lines assigned to each column of pixels alternately cross scanning lines, and they can be simultaneously driven corresponding to two different scanning lines like one data line of a conventional matrix structure. As a result, the dwell time of a matrix type flat-panel display device can be increased and accordingly the brightness can also be increased.

Figure 2:
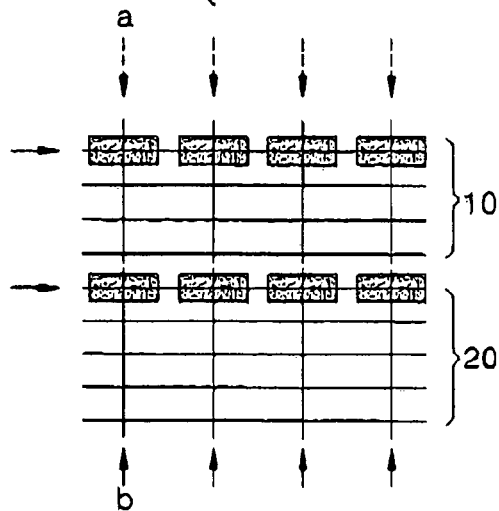
FIG. 2 is a diagram illustrating a method for driving a conventional matrix type flat-panel display device in which data lines are divided into upper and lower parts.

The flat-panel display device according to the present invention, which has a structure in which two data lines are formed for each column of pixels, has the same dwell time as a flat-panel display device having the structure illustrated in FIG. 2, in which data lines are divided into upper and lower groups and the two groups are separately driven. Also, in the conventional matrix structure illustrated in FIG. 2, the division of the data lines is performed on a screen, and accordingly, divided picture images may be displayed on that screen. However, in the case of the structure according to the present invention, in which two data lines are arranged for each column of pixels, the division of data lines is not performed on a screen and consequently picture images displayed on that screen are always clean.

Figure 4:
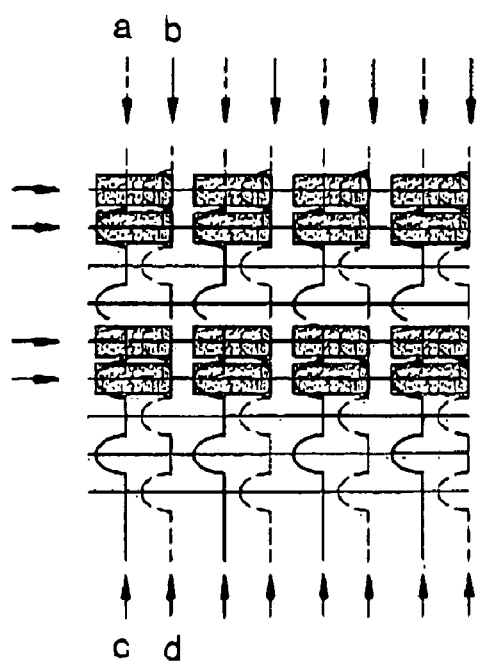
FIG. 4 is a diagram illustrating the structure of data lines of an embodiment in which the structures of data lines illustrated in FIGS. 2 and 3 are applied, and a method for driving a multi type flat-panel display device having the data line structure.

As illustrated in FIG. 4, in the case of the combination of the structure of FIG. 3 with that of FIG. 2, four scan lines can be driven at the same time along with simultaneously driven data lines of upper and lower parts (e.g., data lines a and b belonging of the upper part and data lines c, d belonging to the lower part). Consequently, the dwell time of a flat-panel display device having the structure illustrated in FIG. 4, in the case of SXGA resolution, is the same as that of a flat-panel display device having a conventional matrix structure in the case of QVGA resolution. Thus, brightness can be greatly improved and problems concerning matrix-drive can be solved by the present invention.

Figure 5:
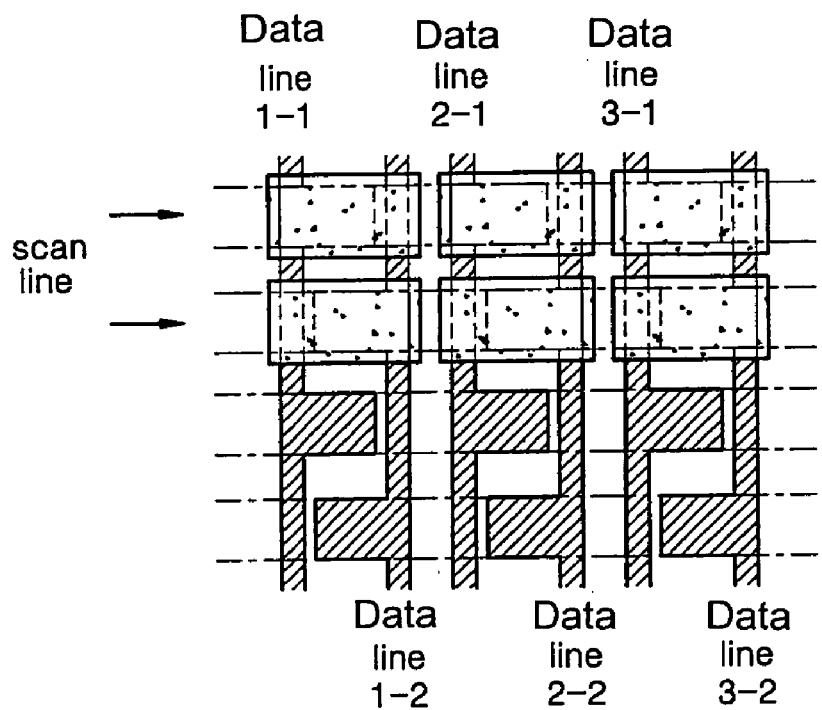
FIGS. 5 and 6 are diagrams showing embodiments of the structure of data lines illustrated in FIG. 3 in which data lines are arranged so as to alternately cross scan lines.
Figure 6:
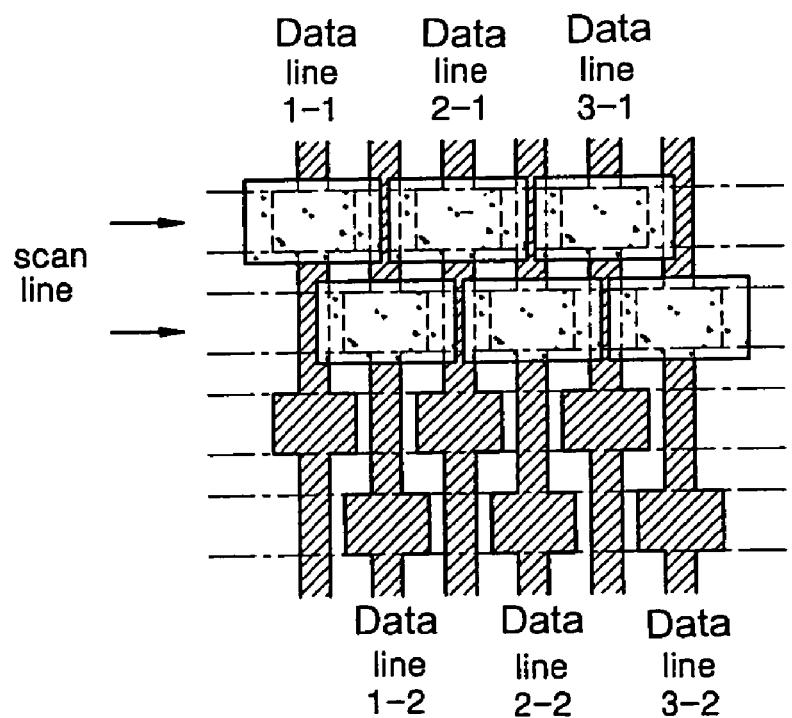

FIGS. 5 and 6 show embodiments having a structure in which data lines assigned to each of a plurality of columns of pixels alternately cross scanning lines. In these figures, a number placed before a symbol, "-" indicates the number of a pixel column and a number placed after the symbol "-" indicates the number of a data line assigned to a pixel column. For example, "Data line 3-2" means that a data line is the second one among data lines belonging to a third pixel column.

In the drawings of these embodiments, a structure in which two data lines are assigned to each pixel column is illustrated. However, three or more data lines may be assigned to each pixel column. For example, if three data lines are allotted to each column of pixels and the data lines alternately cross scanning lines, three data lines can be driven simultaneously and therefore the dwell time can be increased by a factor of three.

The operational principle of a flat-panel display device in which a plurality of data lines are arranged to alternately crossing scan lines is as follows. The electrode structure illustrated in FIG. 3 has two data lines alternately cross scan lines to be simultaneously driven like one data line. In this case, two scan lines can be driven at the same time and then the dwell time of a flat-panel display device can be doubled. If a flat-panel display device has the electrode structure illustrated in FIG. 4, four scan lines can be driven at the same time and then the dwell time of the flat-panel display device can be quadrupled.

The structure in which each pixel column has a plurality of data lines, can be applied to a flat-panel display device such as a liquid crystal display device, a plasma display panel, an electroluminescent display (EL), and a field emission display device.

As described above, the matrix type flat-panel display device having multi data lines, in which a plurality of data lines are assigned to each of a plurality of columns consisting of pixels and the data lines are arranged to alternately cross each scanning line corresponding one-to-one with pixels to which each row of scan lines is connected, makes it possible to increase the number of scan lines which can be simultaneously driven, thereby increasing the dwell time by multiplying it by the number of the data lines assigned to each pixel column.

In the case of applying this structure to a high resolution flat-panel display device, the brightness of a flat-panel display device can be increased due to the increase of the dwell time. Therefore, the problem of a matrix structure, that is, the decrease of brightness caused by the decrease in the dwell time can be easily overcome through the application of the electrode structure according to the present invention.

What is claimed is:

1. A matrix type flat-panel display device comprising:
   a first plate;
   a second plate having a surface uniformly spaced from said first plate;
   scan lines on said first plate arranged so as to correspond to pixel rows in a first direction; and
   data lines on said second plate arranged in a striped pattern in a second direction crossing said scan lines,
   wherein at least two data lines correspond to each pixel column such that, when at least two scan lines and at least two data lines corresponding to a pixel column are biased appropriately, at least two adjacent pixels in said column are simultaneously operated; and
   wherein a first pixel of said at least two adjacent pixels in said column is centered on a first one of said at least two data lines, and a second pixel of said at least two adjacent pixels in said column is centered on a second one of said at least two data lines, such that said first pixel overlaps at least the second one of said two data lines and said second pixel overlaps at least the first one of said two data lines.

2. The matrix type flat-panel display device of claim 1, wherein said scan lines are divided into upper and lower groups, which are separately driven.

3. A method for driving a matrix type flat-panel display device that comprises a first plate; a second plate having a surface uniformly spaced from said first plate; scan lines on said first plate arranged so as to correspond to pixel rows in a first direction; and data lines on said second plate arranged in a striped pattern in a second direction crossing said scan lines, wherein at least two data lines correspond to each pixel column such that, when at least two scan lines and at least two data lines corresponding to a pixel column are biased appropriately, at least two adjacent pixels in said column are simultaneously operated; and wherein a first pixel of said at least two adjacent pixels in said column is centered on a first one of said at least two data lines, and a second pixel of said at least two adjacent pixels in said column is centered on a second one of said at least two data lines, such that said first pixel overlaps at least the second one of said two data lines and said second pixel overlaps at least the first one of said two data lines, said method comprising the steps of:

applying a data signal to each of the data lines arranged to correspond to a column of pixels at the same time; and simultaneously driving as many of the scan lines as the data lines arranged to correspond to a column of pixels in response to the data signal such that at least two adjacent pixels in a column are simultaneously operated.

4. A method for driving a matrix type flat-panel display device that comprises a first plate; a second plate having a surface uniformly spaced from said first plate; scan lines on said first plate arranged so as to correspond to pixel rows in a first direction; and data lines on said second plate arranged in a striped pattern in a second direction crossing said scan lines, wherein at least two data lines correspond to each pixel column and wherein a first pixel of at least two adjacent pixels in said column is centered on a first one of said at least two data lines, and a second pixel of said at least two adjacent pixels in said column is centered on a second one of said at least two data lines, such that said first pixel overlaps at least the second one of said two data lines and said second pixel overlaps at least the first one of said two data lines, said method of driving the display device, comprising the step of:

simultaneously driving said at least two data lines and at least two scan lines, wherein the dwell time of said matrix type flat-panel display device is increased relative to a matrix type flat-panel display device in which the at least two data lines and at least two scanning lines are not driven simultaneously.

5. A method for driving a matrix type flat-panel display device that comprises a first plate; a second plate having a surface uniformly spaced from said first plate; scan lines on said first plate arranged so as to correspond to pixel rows in a first direction; and data lines on said second plate arranged in a striped pattern in a second direction crossing said scan lines, wherein at least two data lines correspond to each pixel column and said scan lines and data lines are divided into an upper group and a lower group, said groups being separately driven, wherein a first pixel of at least two adjacent pixels in said column is centered on a first one of said at least two data lines, and a second pixel of said at least two adjacent pixels in said column is centered on a second one of said at least two data lines, such that said first pixel overlaps at least the second one of said two data lines and said second pixel overlaps at least the first one of said two data lines, said method of driving the display device, comprising the step of:

simultaneously driving said at least two data lines and at least two scan lines in each said upper and lower groups, wherein the dwell time of said matrix type flat-panel display device is increased relative to a matrix type flat-panel display device in which the at least two data lines and at least two scanning lines are not driven simultaneously.

* * * * *